US010609825B1

(12) United States Patent
Kruse et al.

(10) Patent No.: US 10,609,825 B1
(45) Date of Patent: Mar. 31, 2020

(54) CABLE ACCESS PLATFORM HAVING EXTERNAL ELECTRONIC MODULES

(71) Applicant: Adtran, Inc., Huntsville, AL (US)

(72) Inventors: Grant J. Kruse, Owens Cross Roads, AL (US); Jon M. Chalmers, Madison, AL (US)

(73) Assignee: Adtran, Inc., Huntsville, AL (US)

( * ) Notice: Subject to any disclaimer, the term of this patent is extended or adjusted under 35 U.S.C. 154(b) by 0 days.

(21) Appl. No.: 16/222,515

(22) Filed: Dec. 17, 2018

(51) Int. Cl.
| | |
|---|---|
| *H05K 5/00* | (2006.01) |
| *H05K 5/02* | (2006.01) |
| *H05K 9/00* | (2006.01) |
| *H05K 7/20* | (2006.01) |
| *H05K 7/14* | (2006.01) |
| *H01R 25/00* | (2006.01) |

(52) U.S. Cl.
CPC ......... *H05K 5/0008* (2013.01); *H05K 5/0021* (2013.01); *H05K 5/0247* (2013.01); *H05K 7/1438* (2013.01); *H05K 7/20409* (2013.01); *H05K 9/0007* (2013.01); *H01R 25/006* (2013.01); *H05K 5/0204* (2013.01)

(58) Field of Classification Search
USPC ...................................................... 361/730
See application file for complete search history.

(56) References Cited

U.S. PATENT DOCUMENTS

| | | | | | |
|---|---|---|---|---|---|
| 3,139,559 | A | * | 6/1964 | Heidler | H05K 7/1427 361/730 |
| 3,364,395 | A | * | 1/1968 | Donofrio | G06F 1/20 361/679.54 |
| 3,467,892 | A | * | 9/1969 | Marshall | G06F 1/18 361/728 |
| 4,002,381 | A | * | 1/1977 | Wagner | H05K 7/1409 312/183 |
| 4,227,237 | A | * | 10/1980 | Matthews | H05K 5/04 361/727 |
| 4,247,882 | A | * | 1/1981 | Prager | H05K 7/186 361/679.4 |
| 5,031,075 | A | * | 7/1991 | Casanova | H05K 7/1445 361/679.02 |
| 5,103,378 | A | * | 4/1992 | Stowers | H05K 7/1425 211/41.17 |
| 5,301,346 | A | * | 4/1994 | Notarianni | G06F 1/1632 361/679.21 |
| 5,398,161 | A | * | 3/1995 | Roy | H05K 7/20545 361/679.01 |
| 5,641,953 | A | * | 6/1997 | Fisher, Jr. | H01H 9/104 200/50.12 |
| 5,737,194 | A | * | 4/1998 | Hopkins | H05K 7/1461 361/728 |
| D410,653 | S | * | 6/1999 | Roy | D13/164 |
| 5,930,113 | A | * | 7/1999 | McCann | H05K 7/20409 361/688 |
| 6,132,104 | A | * | 10/2000 | Bliss | H01S 3/06704 385/135 |

(Continued)

*Primary Examiner* — William H. Mayo, III
*Assistant Examiner* — Krystal Robinson
(74) *Attorney, Agent, or Firm* — Smith Tempel Blaha LLC; Michael J. Tempel

(57) ABSTRACT

An electronic system may include a housing and one or more electronic modules. The housing and electronic modules may be configured to allow different numbers and types of electronic modules to be attached to the exterior of the housing.

20 Claims, 4 Drawing Sheets

(56) References Cited

U.S. PATENT DOCUMENTS

| | | | | |
|---|---|---|---|---|
| 6,335,868 B1* | 1/2002 | Butterbaugh | | G06F 1/181 |
| | | | | 220/4.02 |
| 6,404,629 B1* | 6/2002 | Austin | | H05K 7/1425 |
| | | | | 169/49 |
| 6,498,732 B2* | 12/2002 | Sucharczuk | | H05K 7/1445 |
| | | | | 361/730 |
| 6,545,611 B2* | 4/2003 | Hayashi | | G02B 6/4455 |
| | | | | 340/686.2 |
| 6,842,348 B2* | 1/2005 | Lee | | H05K 9/0062 |
| | | | | 361/741 |
| 6,847,521 B2* | 1/2005 | Beall | | H05K 7/1454 |
| | | | | 312/223.2 |
| 6,850,408 B1* | 2/2005 | Coglitore | | G06F 1/18 |
| | | | | 312/223.1 |
| 6,865,092 B2* | 3/2005 | Joist | | H05K 9/0016 |
| | | | | 174/368 |
| 7,307,851 B2* | 12/2007 | Dimarco | | H05K 7/1407 |
| | | | | 361/752 |
| 9,333,599 B2* | 5/2016 | de Bock | | H05K 9/0062 |
| 9,392,725 B2* | 7/2016 | Stringer | | H05K 7/20009 |
| 10,065,793 B2* | 9/2018 | Guo | | B65D 85/30 |
| 10,136,557 B2* | 11/2018 | Kim | | H05K 7/20672 |
| 2006/0133033 A1* | 6/2006 | Straub, Jr. | | H05K 7/20563 |
| | | | | 361/690 |
| 2006/0231278 A1* | 10/2006 | Cardenas | | H02G 3/081 |
| | | | | 174/50 |
| 2007/0030658 A1* | 2/2007 | Norgard | | H05K 7/1425 |
| | | | | 361/730 |
| 2007/0053146 A1* | 3/2007 | Lee | | B65D 21/083 |
| | | | | 361/679.22 |
| 2008/0218980 A1* | 9/2008 | Tracewell | | H05K 7/20672 |
| | | | | 361/713 |
| 2009/0294611 A1* | 12/2009 | Tsai | | G06F 1/183 |
| | | | | 248/220.21 |
| 2010/0048047 A1* | 2/2010 | Parrish | | H01R 13/447 |
| | | | | 439/142 |
| 2011/0141692 A1* | 6/2011 | Bult | | H05K 7/1404 |
| | | | | 361/700 |
| 2012/0268866 A1* | 10/2012 | Guering | | H02G 3/00 |
| | | | | 361/627 |
| 2015/0013941 A1* | 1/2015 | Wong | | H05K 7/20663 |
| | | | | 165/104.21 |
| 2016/0360648 A1* | 12/2016 | Brehin | | H04Q 1/09 |
| 2017/0245396 A1* | 8/2017 | Bilski, Jr. | | H05K 7/20672 |

* cited by examiner

CABLE ACCESS PLATFORM HAVING EXTERNAL ELECTRONIC MODULES

BACKGROUND

Electronic equipment may be enclosed within a generally box-shaped chassis, housing, or similar enclosure. For example, a cable access network may include various electronic devices enclosed in housings and interconnected by fiber-optic or copper cables, or other wired or wireless connections. In a cable access network, the types of electronic devices that may be housed may include, for example, optical receivers and transmitters, optical amplifiers, radio frequency amplifiers, optical switches, etc. A housing containing cable access network equipment may be made of cast metal or other rugged material to withstand harsh outdoor environments as well as to facilitate heat dissipation. The housing may have an array of heat dissipation fins to dissipate excess thermal energy produced by the operation of the electronics within the housing. The housing may be sealed in a manner that provides electromagnetic interference (EMI) shielding. Nevertheless, thermal dissipation requirements and other requirements vary depending on the type of equipment and operating environment. A particular housing design therefore generally takes into account specific requirements relating to the combination of electronic devices to be contained. Accordingly, a wide variety of housing designs are known, each associated with a specific type of equipment. Even within the realm of cable access networks, there is no one housing design that is suitable for many different types of equipment.

SUMMARY

In an exemplary embodiment, an electronic system may include a housing and one or more electronic modules. The housing and electronic modules may be configured to allow different numbers and types of electronic modules to be attached to the housing.

The housing contains a housing electronic system, such as, for example, a power supply, and has a plurality of housing walls and a housing mounting face. The housing mounting face has a plurality of housing openings into the housing interior. Each housing opening may be within a surrounding mounting rim of the housing mounting face.

Each electronic module contains a module electronic system and has a plurality of module walls and a module mounting face. The module mounting face may be defined by a module rim around the module interior. The module rim may be mounted to one of the housing mounting rims by user-removable fasteners. When a module is mounted in this manner, the module mounting face spans an area of the housing mounting face that is less than the full area of the housing mounting face. The remaining area of the housing mounting face may be occupied by other modules mounted in a similar manner A module electronic system may include one or more electronic devices, such as, for example, optical receivers and transmitters, optical amplifiers, radio frequency amplifiers, optical switches, etc.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
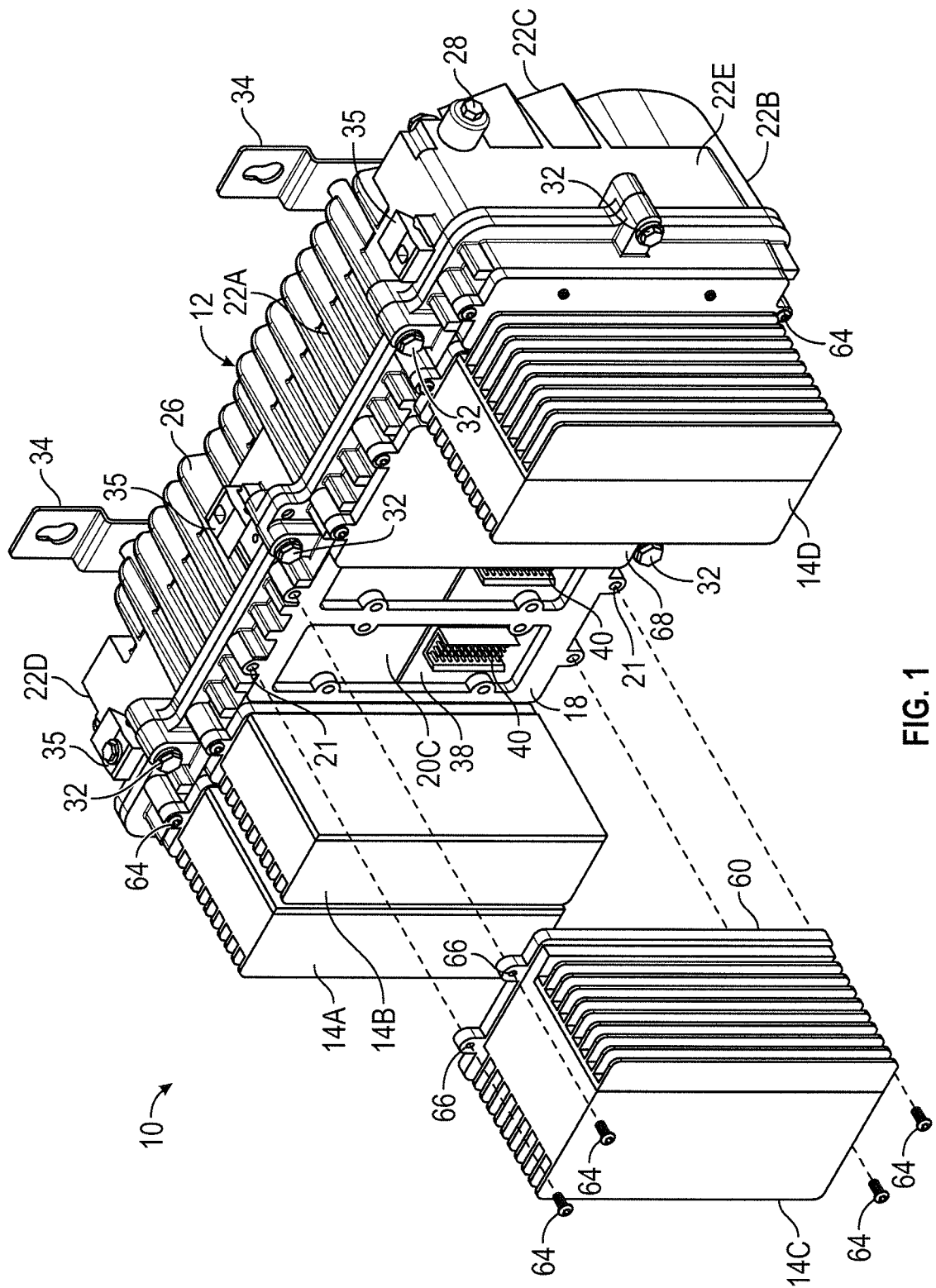
FIG. 1 is a perspective view of a system comprising a housing and an electronic module, with the module shown in a removed position, in accordance with an exemplary embodiment.

As illustrated in FIG. 1, in an illustrative or exemplary embodiment, an electronic system 10 includes a housing 12 and electronic modules 14A, 14B, 14C, and 14D (which may be referred to collectively as electronic modules 14). Although four electronic modules 14 of various sizes and types are shown in FIG. 1 as an example, such a system may include any number of such electronic modules. As described in further detail below, housing 12 and electronic modules 14 are configured in a manner that allows different numbers and types of electronic modules 14 to be attached to the exterior of housing 12. In FIG. 1, to illustrate a user-removability feature (described below in further detail) electronic module 14C is shown in a position removed from housing 12 while electronic modules 14A, 14B, and 14D are shown in a position attached to housing 12, but it should be understood that all electronic modules 14 are similarly user-removable and user-attachable.

Figure 2:
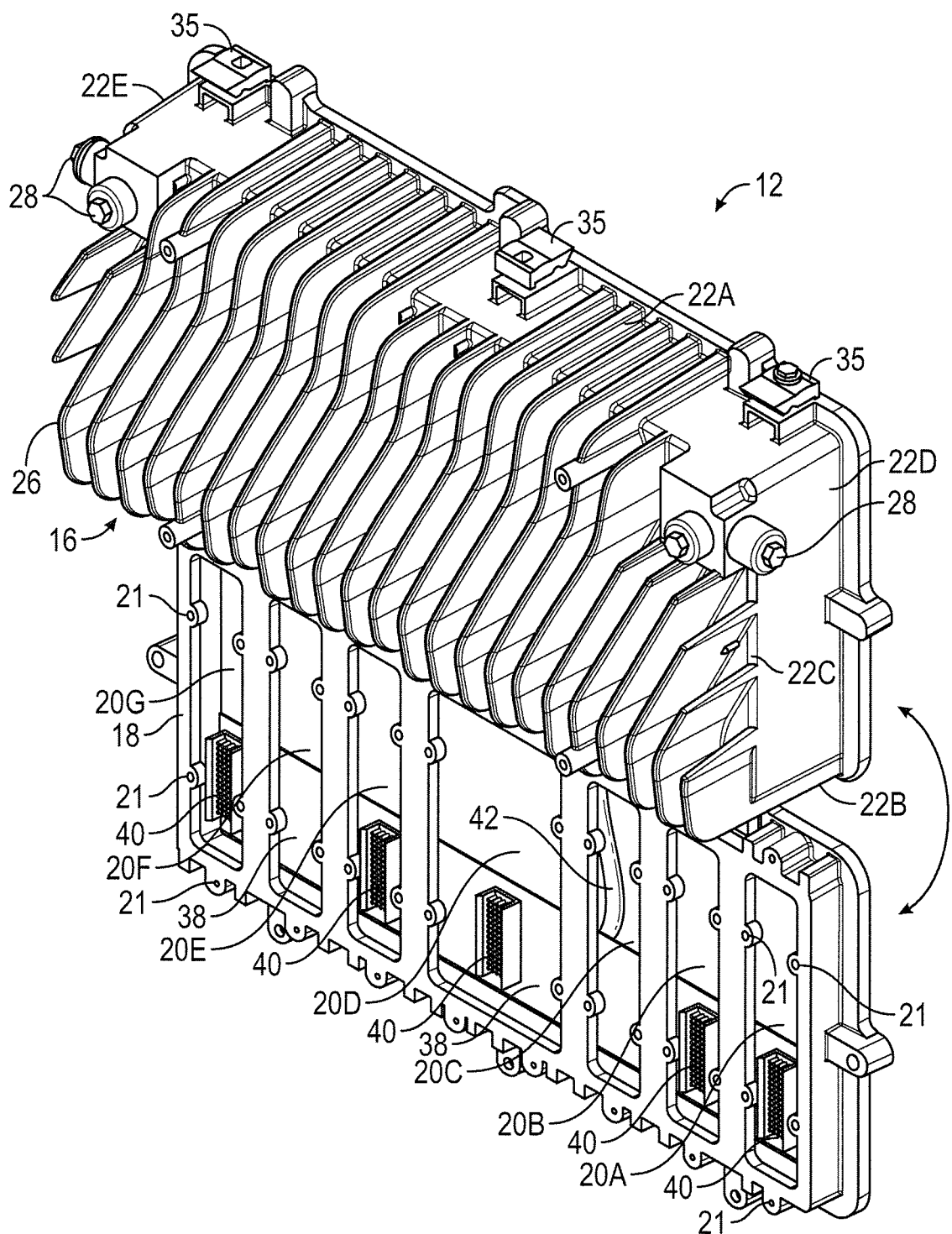
FIG. 2 is a perspective view of the housing of FIG. 1.

As further illustrated in FIG. 2, housing 12 has a generally elongated shape and includes a housing base 16 and a housing mounting face 18. Housing 12 may be made of materials that are resistant to damage from weather and ultraviolet radiation, provide electromagnetic interference (EMI) shielding, and facilitate heat dissipation. For example, housing 12 may be made entirely of cast metal. Housing mounting face 18 has housing openings 20A, 20B, 20C, 20D, 20E, 20F, and 20G (which may be referred to collectively as housing openings 20) arrayed adjacent one another in the length direction of housing 12, i.e., the direction or axis along which housing 12 is elongated. As described below, the portion of housing mounting face 18 immediately surrounding each housing opening 20 may serve as a mounting rim, or mounting face, or mounting surface, for one of electronic modules 14. On or immediately adjacent each mounting rim are screw holes 21 to facilitate attaching electronic modules 14. Although in the illustrated embodiment each housing opening 20 has a generally rectangular shape and extends nearly the entire height of housing mounting face 18, in other embodiments each such opening may have any other shape and size, and there may be more than one such opening within a mounting rim.

Figure 3:
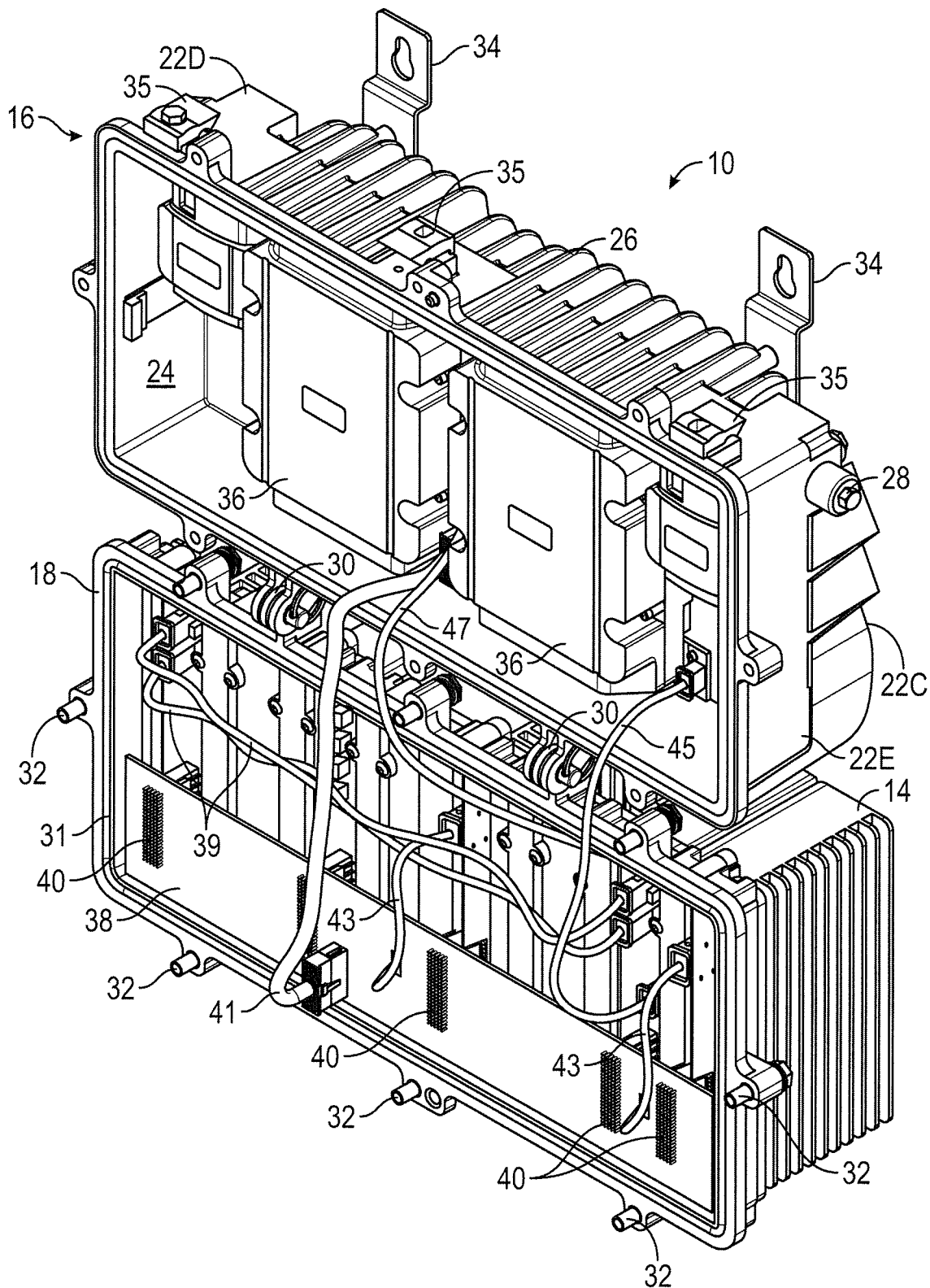
FIG. 3 is a perspective view of the system of FIG. 1, showing the housing in an open position to reveal the interior.

Housing base 16 is defined by a housing top wall 22A, a housing bottom wall 22B, a housing rear wall 22C, and two housing end walls 22D and 22E (which may be referred to collectively as housing walls 22). Housing walls 22 enclose and thus define a housing interior 24 (FIG. 3). Housing interior 24 is fully enclosed on all except one side by housing walls 22, thus providing housing base 16 with a generally tub-shaped or trough-shaped form. Mounting face 18 is the one side of housing 12 that is not fully enclosed. The term "fully enclosed" is intended to mean sufficiently closed (or user-closeable) to shield or seal housing interior 24 against EMI, moisture intrusion, etc. Housing openings 20 of mounting face 18 open into housing interior 24. That is, housing openings 20 define passages between housing interior 24 and the exterior of housing 12.

Housing top wall 22A, housing bottom wall 22B, and housing rear wall 22C each have an array of heat dissipation fins 26. As further described below, the function of dissipating excess heat is distributed between housing 12 and electronic modules 14. Housing base 16 may include a number of ports 28 to which fiber-optic or coaxial copper cables (not shown) may be coupled. Other interfaces which may be associated with the port 28 may include, for example, a radio frequency (RF) antenna and related electronics, or other wired or wireless interfaces, which may be used to provide signal ingress and signal egress to and from the housing 12. A user may plug any unused ports 28 to aid EMI shielding of housing interior 24.

Housing mounting face 18 is connected to housing base 16 by hinges 30 (FIG. 3). As indicated by the arrow in FIG. 2, housing mounting face 18 may be moved or swung on hinges 30 between the open position shown in FIGS. 2-3 and the closed position shown in FIG. 1. In the closed position, housing mounting face 18 covers housing interior 24. The perimeter of housing mounting face 18 is substantially the same size and shape as the perimeter of housing base 16 around housing interior 24 so that in the closed position the portions of housing mounting face 18 and housing base 16 that contact each other form a seal against EMI, moisture, etc. A sealing gasket 31 (FIG. 3) may be included in the perimeter of one or both of housing base 16 and housing mounting face 18. Screws 32 or other fasteners may secure housing mounting face 18 and housing base 16 together in the closed housing position. Although in the illustrated embodiment housing 12 is defined by two portions connected by hinges 30, in other embodiments such a housing may be defined by any one or more elements formed in any other manner. Housing 12 may include brackets 34 (FIGS. 1 and 3) for mounting housing 12 to a structure such as an equipment cabinet wall (not shown). Housing 12 may include strand mounting clamps 35 for suspending housing 12 from wires in an outdoor aerial deployment.

As illustrated in FIG. 3, a housing electronic system contained within housing interior 24 may include one or more power supplies 36, a backplane 38, and other elements. In an exemplary embodiment, backplane 38 may be attached to the interior side of housing mounting face 18. Backplane 38 may comprise, for example, a circuit board that provides one or more of a power interface, a data interface, a high-speed data bus or interface, or other connectivity and/or interoperability, to one or more electronic modules that may be coupled to the backplane 38. Backplane 38 may span all of the housing openings 20. Nevertheless, in other embodiments (not shown), such a backplane may span fewer than all such housing openings. In still other embodiments, such a backplane may be omitted entirely and signals for power, data and other signals may be routed by cables or wires. In the illustrated embodiment, two or more electrical connectors 40 may be arrayed on backplane 38, aligned with housing openings 20. In the illustrated embodiment, for example, an electrical connector 40 is aligned with some, but not all, housing openings 20. In other embodiments (not shown), at least one such backplane connector may be aligned with each such housing opening. Electrical connectors 40 may comprise, for example, arrays of pins or similar conductors that extend from backplane 38 toward (or into) housing openings 20. Nevertheless, in other embodiments such backplane connectors may be of any other type. Also, although in the illustrated embodiment each electrical connector 40 occupies only a small fraction of the area of a housing opening 20, in other embodiments (not shown) a backplane connector or portion thereof may occupy up to the entire area of such a housing opening or openings. Alternatively, the backplane 38 may provide connectivity and interoperability between and among any electronic modules that may be connected to the backplane 38. In some alternative embodiments, the backplane 38 may be partially or fully omitted, with cabling providing power and/or data interconnectivity to any electronic modules coupled to the housing 12. For example, cabling may include module cabling 39 between electronic modules, power cabling 41 between the power supply 36 and the backplane 38, module cabling 43 between electronic modules and the backplane 38, power cabling 45 between the power supply 36 and an electronic module, and a ground cable 47. Other cabling may also be provided with or without the backplane 38.

Wires, or power cabling, 41 may couple power signals from power supplies 36 to electrical connectors 40 via conductive traces (not shown) of backplane 38. A ground wire, or ground cable, 47 from power supply 36 may be connected to housing base 16. In addition to the conductive traces that convey power signals to electrical connectors 40, backplane 38 may have other conductive traces (not shown) that convey other signals between electrical connectors 40.

Figure 4:
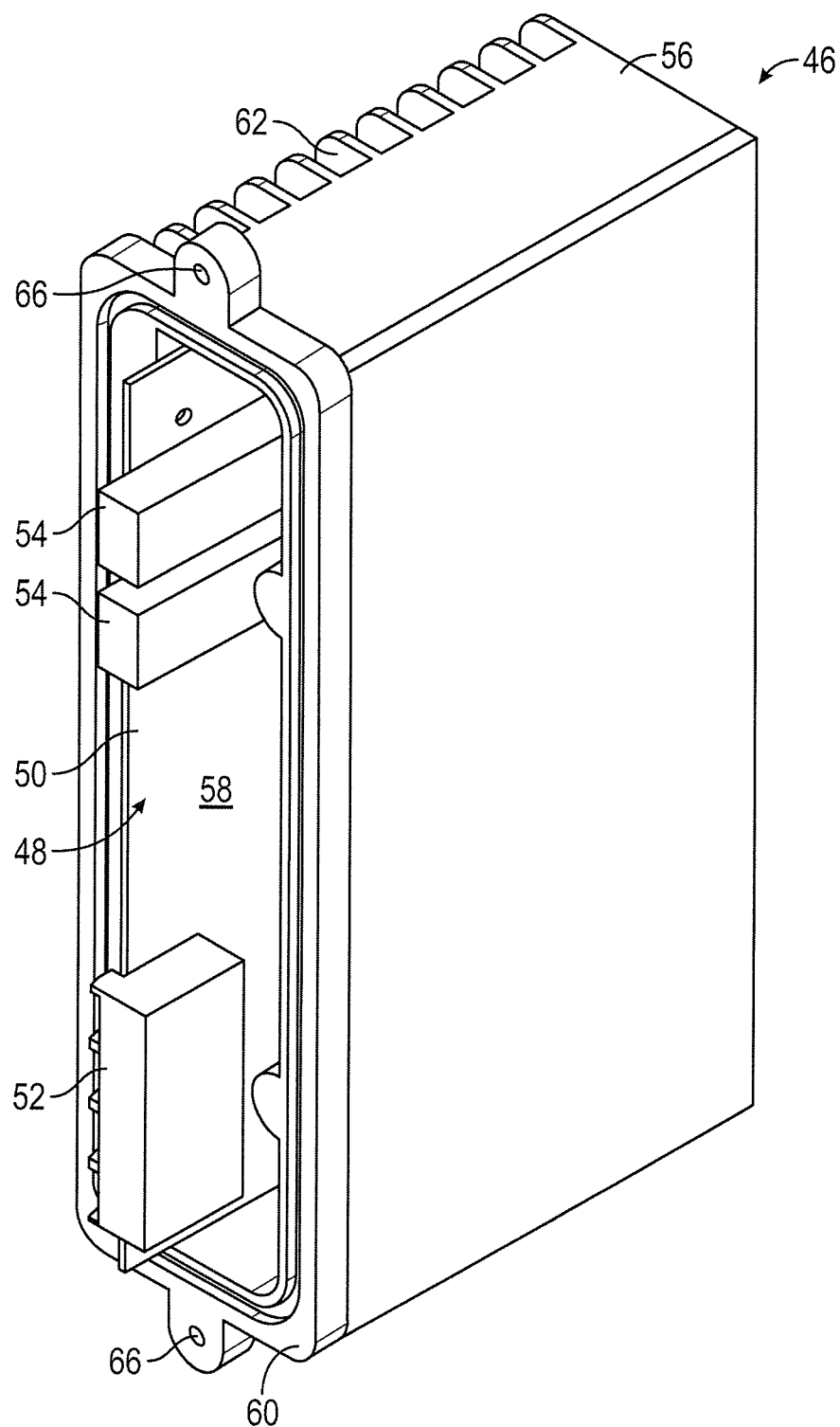
FIG. 4 is a perspective view of an electronic module of the system, in accordance with an exemplary embodiment.

As illustrated in FIG. 4, an electronic module 46 may contain a module electronic system 48. Electronic module 46 is an example of above-described electronic modules 14 (FIG. 1) and therefore may be similar to any or all of electronic modules 14A-14D or other electronic modules 14. Accordingly, the following descriptions apply to all electronic modules 14.

Module electronic system 48 may include, for example, a circuit board 50 on which are mounted one or more connectors 52 and one or more electronic devices 54. A connector 52 may be any of various types. For example, connector 52 may be an electrical connector that is mateable with one of above-described electrical connectors 40. An electronic device 54 may be any of various types. For example, electronic devices 54 may include optical transceivers, optical transmitters, optical receivers, radio frequency amplifiers, optical amplifiers, optical switches, etc. In alternative embodiments, electronic devices 54 may also include other elements, such as, for example only, an Ethernet switch having one or more electrical interfaces, a 4G (LTE) or 5G small cell access point, a WiFi access point, a DOCSIS (data over cable service interface specification) MAC (media access control)-only module, a MAC PHY (physical) module, or a PHY-only module, a PON (passive optical network, including various permutations of a PON, referred to as xPON), an ONT (optical network terminal), an OLT (optical line terminal), an ONU (optical network unit), or another electrical or optical module. Power, signal, data and any other signals may be taken from and provided to the electronic devices 54 using interfaces that may include cable, such as coaxial cable, fiber optic cable, or other cable, wireless connections such as a radio frequency (RF) interface, or other wired or wireless interfaces. The term "LTE" refers to as a long term evolution communication network, and is sometimes also referred to as a 4G network. The term "5G" refers to an evolving generation of LTE communication technology. One evolving technology is the ability to communicate over higher frequencies than LTE, such as at millimeter-wave (mmw) frequencies. For example, mmw signals are those that operate at extremely high frequencies, such as 20-30 Gigahertz (GHz) and beyond. Some types of electronic devices, such as modular optical transceivers, transmitters, receivers, etc., may have integrated or built-in optical connectors, which may be used to couple signals between electronic module 46 and other electronic modules 14 or between electronic module 46 and one or more of ports 28 (FIGS. 1-3).

The combination of electronic devices 54 included in electronic module 46 may characterize the function of electronic module 46 and distinguish electronic module 46 from other electronic modules 14 having other combinations of electronic devices. For example, electronic modules 14A, 14B, 14C, and 14D (FIG. 1) each may have a combination of electronic devices that is different from the others. Multiple electronic modules 14 may be provided from which a user may select one or more to attach to housing 12.

Electronic module 46 has a module case 56 defined by module walls enclosing a module interior 58 on all but one side. That side, which may be referred to as a module mounting face, is defined by a module rim 60 around module interior 58. In the illustrated embodiment, module 46 has a generally rectangular or six-sided box shape. The exterior of module case 56 may have an array of heat dissipation fins 62 on one or more sides. The heat dissipation fins 62 may be selected based on a desired heat dissipation profile of an electronic module 46. The heat dissipation fins 62 may be located on one or more sides or edges of an electronic module 46, and may be asymmetrically designed so that the heat dissipation provided by the dissipation fins 62 may vary from one portion of an electronic module to another portion of an electronic module. Individual ones of the heat dissipation fins 62 may have different shapes, sizes, heights, widths, depths or other features of other of the heat dissipation fins 62 so that different heat dissipation cap be accommodated for each electronic module.

Referring again to FIG. 1, a user may mount or attach any electronic module 14 to housing mounting face 18 and remove any attached electronic module 14 from housing mounting face 18. In the illustrated embodiment, screws 64 may be passed through holes 66 in or adjacent to module rim 60 and thread into screw holes 21. Nevertheless, in other embodiments (not shown) fasteners that a user similarly may readily secure and release, such as latches, may be provided instead of screws 64.

In the attached position (in which modules 14A, 14B, and 14D are shown as examples in FIG. 1), module rim 60 contacts one of the mounting rims of housing mounting face 18 within one of the plurality of housing openings 20. In the attached position, the entirety of the module rim 60 is in contact with housing mounting face 18 to provide an EMI seal. In attaching an electronic module 14 to housing 12, as the user moves electronic module 14 into proximity with housing mounting face 18, connector 52 (FIG. 4) mates with one of electrical connectors 40.

Housing walls 22, housing mounting face 18, module case 56 (FIG. 4), and module rim 60 together provide EMI shielding to housing interior 24 and module interior 58. Also, in the illustrated embodiment, a combined effect of the metal-to-metal connection or attachment between housing 12 and module case 56, and the relatively large housing opening 20, is the distribution of the heat dissipation function between housing 12 and modules 14. The heat dissipation function is further distributed between housing 12 and modules 14 by housing 12 having an array of heat dissipation fins 26 and modules 14 (e.g., module 46) also having an array of heat dissipation fins 62. Depending on the relative amount of heat generated by devices within housing 12 and by devices within module 46, module 46 can be provided with more or fewer heat dissipation fins 62. Note, for example, in FIG. 1 electronic modules 14C and 14D each have heat dissipation fins on two sidewalls, while electronic modules 14A and 14B each have heat dissipation fins on only one sidewall. Other configurations of heat dissipation fins 26 and heat dissipation fins 62 are contemplated, based at least partially on the heat dissipation profile of the housing 12 and the heat dissipation profile of the electronic modules 14.

Note that each attached electronic module 14 spans or covers less than the full area of housing mounting face 18. For example, the length of each electronic module 14 may be less than the full length of housing mounting face 18. Thus, multiple electronic modules 14 may be attached adjacent or side-by-side each other along the length of housing mounting face 18, as in the exemplary configuration shown in FIG. 1. Note that an attached electronic module 14, such as electronic module 14B, may have an array of heat dissipation fins 62 immediately adjacent another attached electronic module 14, such as electronic module 14A. In other words, there may be heat dissipation fins 62 between two electronic modules 14 that have essentially no space between them, i.e., abutting each other. Each electronic module 14 may be the same height as housing 12 so as to provide system 10 with a uniform profile.

In the exemplary configuration shown in FIG. 1, the attached electronic modules 14 cover housing openings 20. A user may install a blank metal plate 68 over any housing openings 20 that are not covered by an attached electronic module 14.

With housing 12 in the open position shown in FIG. 3, a user may connect various cables (not shown) between the attached electronic modules 14 or between attached electronic modules 14 and ports 28. A user may readily remove an attached electronic module 14 by unplugging or otherwise disconnecting any such cables, removing screws 64, and withdrawing the electronic module 14. In this manner a user may reconfigure the same housing 12 with a different combination of one or more electronic modules 14.

One or more illustrative or exemplary embodiments of the invention have been described above. However, it is to be understood that the invention is defined by the appended claims and is not limited to the specific embodiments described.

What is claimed is:

1. An electronic system, comprising:
   a housing containing a housing electronic system and having a plurality of housing walls and a housing mounting face, the plurality of housing walls enclosing a housing interior, the housing mounting face having a plurality of housing openings into the housing interior, each housing opening within a mounting rim on the housing mounting face; and
   one or more electronic modules, each electronic module containing a module electronic system and having a plurality of module walls and a module mounting face, the plurality of module walls enclosing a module interior, the module mounting face defined by a module rim around the module interior, each electronic module mounted externally to the housing with the module rim of each electronic module mounted to one of the mounting rims by user-removable fasteners, the module mounting face of each electronic module spanning an area of the housing mounting face less than a full area of the housing mounting face.

2. The electronic system of claim 1, wherein the module electronic system includes an electronic device comprising at least one of an optical transceiver, an optical receiver, an optical transmitter, a radio frequency amplifier, an optical amplifier, an optical switch, an Ethernet switch, a 4G (LTE) small cell access point, a 5G small cell access point, a WiFi access point, a DOCSIS (data over cable service interface specification) MAC (media access control)-only module, a MAC PHY (physical) module, or a PHY-only module, a PON (passive optical network, an ONT (optical network terminal), an OLT (optical line terminal), and an ONU (optical network unit).

3. The electronic system of claim 1, wherein the one or more electronic modules comprise a first electronic module having a first combination of one or more electronic devices and a second electronic module having a second combination of one or more electronic devices different from the first combination.

4. The electronic system of claim 1, wherein a housing electrical connector of the housing electronic system is coupled to a module electrical connector of the module electronic system through the housing opening.

5. The electronic system of claim 4, wherein the housing electronic system includes a power supply coupled through the housing electrical connector and module electrical connector to the module electronic system.

6. The electronic system of claim 5, wherein the housing electronic system includes a backplane configured to couple the power supply to a plurality of housing electrical connectors, and each of the plurality of housing electrical connectors is coupled to a corresponding one of a plurality of module electrical connectors through a corresponding one of the plurality of housing openings.

7. The electronic system of claim 1, wherein the housing has an elongated shape, and the plurality of housing openings of the housing mounting face are arrayed adjacent one another in a direction of elongation of the housing.

8. The electronic system of claim 7, wherein:
the one or more electronic modules comprise a first electronic module having a module mounting face spanning a first distance in the direction of elongation of the housing; and
the one or more electronic modules comprise a second electronic module having a module mounting face spanning a second distance in the direction of elongation of the housing.

9. The electronic system of claim 7, wherein the plurality of housing walls are formed in fixed relation to each other to define a tub-shaped housing base, and a hinged connection connects the housing mounting face to the housing base.

10. The electronic system of claim 1, wherein:
the housing walls, housing mounting face, module walls, and module mounting face are configured to provide electromagnetic interference (EMI) shielding to the housing interior and module interior; and
the module rim and the mounting rim are fully in contact with each other to form an EMI seal.

11. The electronic system of claim 1, wherein at least one of the plurality of housing walls has a heat dissipation fin array.

12. The electronic system of claim 11, wherein at least one of the plurality of module walls has a heat dissipation fin array.

13. An electronic system, comprising:
a housing containing a housing electronic system, the housing comprising an elongated tub-shaped housing base defined by a plurality of housing walls enclosing a housing interior, the housing further comprising an elongated housing mounting face connected to the housing base and covering the housing interior, the housing mounting face having a plurality of housing openings arrayed adjacent one another in a direction of elongation of the housing mounting face, each housing opening within a mounting rim on the housing mounting face;
a first electronic module containing a first module electronic system, the first electronic module having first module walls enclosing a first module interior and having a first module mounting face defined by a first module rim around the first module interior, the first electronic module mounted externally to the housing with the first module rim contacting and attached to a first one of the mounting rims by user-removable fasteners; and
a second electronic module containing a second module electronic system, the first electronic module having second module walls enclosing a second module interior and having a second module mounting face defined by a second module rim around the second module interior, the second electronic module mounted externally to the housing with the second module rim contacting and attached to a second one of the mounting rims by user-removable fasteners.

14. The electronic system of claim 13, wherein the module electronic system includes an electronic device comprising at least one of an optical transceiver, an optical receiver, an optical transmitter, a radio frequency amplifier, an optical amplifier, an optical switch, an Ethernet switch, a 4G (LTE) small cell access point, a 5G small cell access point, a WiFi access point, a DOCSIS (data over cable service interface specification) MAC (media access control)-only module, a MAC PHY (physical) module, or a PHY-only module, a PON (passive optical network, an ONT (optical network terminal), an OLT (optical line terminal), and an ONU (optical network unit).

15. The electronic system of claim 14, wherein:
the first electronic module includes a first combination of one or more electronic devices; and
the second electronic module includes a second combination of one or more electronic devices different from the first combination.

16. The electronic system of claim 13, wherein:
a first housing electrical connector of the housing electronic system is coupled to a first module electrical connector of the first module electronic system through a first housing opening; and
a second housing electrical connector of the housing electronic system is coupled to a second module electrical connector of the second module electronic system through a second housing opening.

17. The electronic system of claim 16, wherein the housing electronic system includes a power supply coupled through the housing electrical connector and the first module electrical connector to the first module electronic system and coupled through the housing electrical connector and the second module electrical connector to the second module electronic system.

18. The electronic system of claim 17, wherein the housing electronic system includes a backplane configured to couple the power supply to the first and second housing electrical connectors.

19. The electronic system of claim 13, wherein:
at least one of the first module walls has a first heat dissipation fin array; and
at least one of the second module walls has a second heat dissipation fin array.

20. The electronic system of claim 19, wherein at least one of the plurality of housing walls has a heat dissipation fin array.

\* \* \* \* \*